US009172005B2

(12) United States Patent
Tasaki et al.

(10) Patent No.: US 9,172,005 B2
(45) Date of Patent: Oct. 27, 2015

(54) SEMICONDUCTOR LIGHT EMITTING DIODE HAVING A CONTACT PORTION AND A REFLECTIVE PORTION (75) Inventors: Norio Tasaki, Akita (JP); Hidetaka Yamada, Akita (JP); Hiroyuki Togawa, Setagaya-ku (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/003,114

(22) PCT Filed: Mar. 9, 2012

(86) PCT No.: PCT/JP2012/001634
§ 371 (c)(1),
(2), (4) Date: Sep. 4, 2013

(87) PCT Pub. No.: WO2012/120894
PCT Pub. Date: Sep. 13, 2012

(65) Prior Publication Data
US 2014/0001508 A1    Jan. 2, 2014

(30) Foreign Application Priority Data
Mar. 10, 2011    (JP) .................... 2011-053399

(51) Int. Cl.
*H01L 33/40*    (2010.01)
*H01L 33/38*    (2010.01)
(Continued)

(52) U.S. Cl.
CPC .............. *H01L 33/40* (2013.01); *H01L 33/405* (2013.01); *H01L 24/05* (2013.01); *H01L 24/85* (2013.01);
(Continued)

(58) Field of Classification Search
CPC ................ H01L 33/40; H01L 33/405; H01L 2224/04042; H01L 24/05; H01L 24/85; H01L 2924/12041; H01L 2924/35121; H01L 2933/0016; H01L 33/14; H01L 33/38; H01L 33/42; H01L 2924/00
USPC ......................................... 257/98–99
See application file for complete search history.

(56) References Cited

U.S. PATENT DOCUMENTS 5,060,051 A    10/1991  Usuda
2006/0067374 A1    3/2006  Kishimoto
(Continued)

FOREIGN PATENT DOCUMENTS

CN    87107402 A    6/1988
CN    101393956 A    3/2009
(Continued)

OTHER PUBLICATIONS

Oct. 7, 2014 Office Action issued in Japanese Application No. 2013-503400.
(Continued)

Primary Examiner — Thanh T Nguyen
(74) Attorney, Agent, or Firm — Oliff PLC (57) ABSTRACT A semiconductor light emitting diode of the present invention includes a semiconductor layer including a light emitting portion, and a pad electrode located on the semiconductor layer, the semiconductor light emitting diode further including, between the semiconductor layer and the pad electrode, a reflective portion including a light transmitting insulating layer serving as a current blocking layer located on the semiconductor layer, and a reflective layer located on the light transmitting insulating layer; a contact portion formed from an ohmic electrode in contact with the reflective portion, located on the semiconductor layer; and a conductive hard film between the reflective layer and the pad electrode, the conductive hard film having HV×t>630, where the Vickers hardness is HV (Hv) and the thickness is t (μm).

7 Claims, 5 Drawing Sheets (51) Int. Cl.
    *H01L 33/42* (2010.01)
    *H01L 23/00* (2006.01)
    *H01L 33/14* (2010.01)

(52) U.S. Cl.
    CPC .............. *H01L 33/14* (2013.01); *H01L 33/38* (2013.01); *H01L 33/42* (2013.01); *H01L 2224/04042* (2013.01); *H01L 2924/12041* (2013.01); *H01L 2924/35121* (2013.01); *H01L 2933/0016* (2013.01)

(56) References Cited

U.S. PATENT DOCUMENTS

2009/0072257 A1　3/2009　Unno et al.
2010/0301362 A1*　12/2010　Iizuka et al. .................... 257/98

FOREIGN PATENT DOCUMENTS

| | | |
|---|---|---|
| CN | 101901862 A | 12/2010 |
| EP | 1 187 200 A2 | 3/2002 |
| JP | A-61-6880 | 1/1986 |
| JP | A-63-148646 | 6/1988 |
| JP | A-1-220850 | 9/1989 |
| JP | H10-225824 A | 8/1998 |
| JP | 2005-203722 A | 7/2005 |
| JP | A-2006-93654 | 4/2006 |
| JP | 2008-223859 A | 9/2008 |
| JP | A-2008-300719 | 12/2008 |
| JP | A-2009-10280 | 1/2009 |
| JP | A-2009-76490 | 4/2009 |
| JP | A-2009-231323 | 10/2009 |
| JP | 2010-278112 A | 12/2010 |
| JP | A-2011-066453 | 3/2011 |

OTHER PUBLICATIONS

Sep. 30, 2014 Office Action issued in Korean Application No. 10-2013-7025556.
Pierson, Hugh O. "Interstitial Nitrides: Properties and General Characteristics;" Handbook of Refractory Carbides and Nitirdes; Chapter 11; 1996; pp. 181-209.
Apr. 10, 2012 International Search Report issued in International Application No. PCT/JP2012/001634.
May 7, 2014 Office Action issued in Japanese Patent Application No. 2013-503400 (with translation).
Jul. 14, 2014 Search Report issued in European Patent Application No. 12755275.0.
Jan. 12, 2015 Office Action issued in Taiwanese Application No. 101108249.
Feb. 27, 2015 Office Action issued in Korean Application No. 10-2013-7025556.
Jul. 2, 2015 Office Action issued in Chinese Patent Applicaiton No. 201280012596.6.

\* cited by examiner

SEMICONDUCTOR LIGHT EMITTING DIODE HAVING A CONTACT PORTION AND A REFLECTIVE PORTION

TECHNICAL FIELD

The present invention relates to a semiconductor light emitting diode and a method of manufacturing the same. In particular, the present invention relates to a semiconductor light emitting diode in which allows peeling of a pad portion incidental to wire bonding is suppressed while minimizing light blocked by the pad electrode, and a method of manufacturing the same.

BACKGROUND ART

In recent years, as uses of light emitting diodes (LEDs) have become diverse, for example, as they come to be applied to headlamps and brake lamps of automobiles, traffic lights, or the like; there has been a demand for improved light output of LEDs.

LEDs are generally semiconductor light emitting diodes having a structure including a p-type semiconductor layer and an n-type semiconductor layer between a top surface electrode and a rear surface electrode, and a light emitting layer provided between the semiconductor layers. The ratio of light emitted from an LED to the total light produced in the light emitting layer is referred to as light extraction efficiency. An Electrode blocks light produced in a light emitting layer, which reduces light extraction efficiency to have been an obstacle to the improvement in the power output of LEDs.

Known techniques for reducing light blocked by an electrode to improve light extraction efficiency include the following. First, PTL 1 discloses a technique of providing a current blocking layer between an electrode layer and an ohmic contact layer, right under a bonding pad, and flowing a current at a portion other than a portion right under the pad, thereby reducing light blocked by the pad. In PTL 1, a semiconductor having an opposite conductivity to an ohmic contact layer is used as the current blocking layer instead of $SiO_2$ or the like.

Further, PTL 2 discloses a technique of providing a light reflective layer made of Au or the like and a light transmitting layer having high thermal conductivity, made of AlN or the like, between a support substrate and a lower clad (semiconductor layer), thereby effectively reflecting light toward the rear surface, while improving dissipation of heat from a light emitting layer.

The structure disclosed by PTL 2 is favorable in terms of improving light extraction efficiency, since AlN which also serves as a light transmitting insulating film is located between the semiconductor layer and the light reflective layer, which suppresses diffusion of impurities into the light reflective layer from the semiconductor layer, and thus a highly reflective interface can be obtained.

CITATION LIST

Patent Literature

PTL 1: JP 61-006880 A
PTL 2: JP 2009-231323 A

SUMMARY OF INVENTION

Technical Problem

Figure 4:
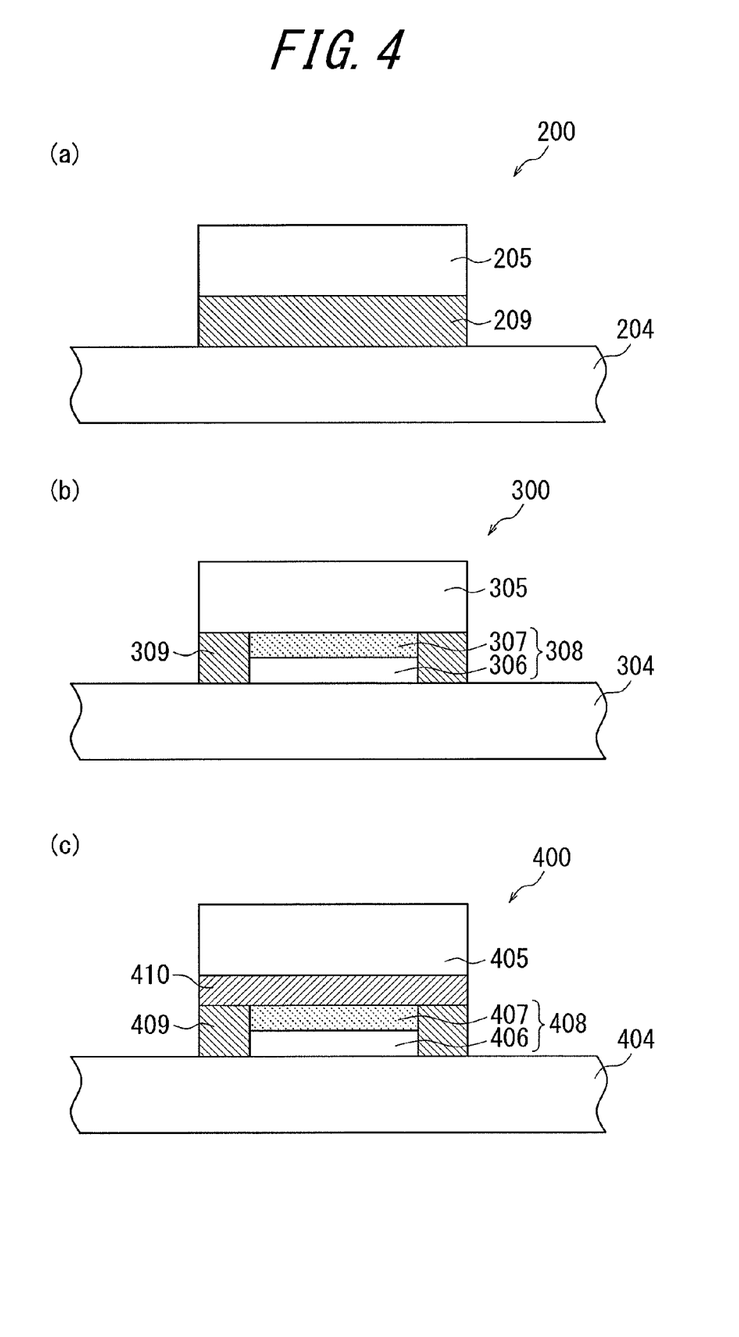
FIG. 4(a) is a schematic cross-sectional view showing a semiconductor light emitting diode 200 of Comparative Example 1.
FIG. 4(b) is a schematic cross-sectional view showing a semiconductor light emitting diode 300 of Comparative Example 2.
FIG. 4(c) is a schematic cross-sectional view showing a semiconductor light emitting diode 400 of Comparative Example 3.

In view of the above, the inventors of the present invention studied semiconductor light emitting diodes like one shown in FIG. 4(b) in order to further reduce light blocked by bonding pads thereby improving light extraction efficiency. A semiconductor light emitting diode 300 shown in FIG. 4(b) has a semiconductor layer 304 including a light emitting portion; a pad electrode 305 located on the semiconductor layer; a reflective portion 308 consisting of a light transmitting insulating layer 306 and a reflective layer 307, between the semiconductor layer 304 and the pad electrode 305; and an ohmic electrode 309. The reflective portion 308 includes the light transmitting insulating layer 306 as a current blocking layer located on the semiconductor layer 304, and the reflective layer 307 located on the light transmitting insulating layer 306. The ohmic electrode 309 is formed to be located on the semiconductor layer 304 so as to contact and surround the reflective portion 308. In FIG. 4(b), a support substrate of the semiconductor layer 304 and a rear surface electrode are omitted in the illustration. For example, the light transmitting insulating layer 306 may be an AlN layer having a thickness of 100 nm; the reflective layer 307 may be a metal layer consisting of 10 nm thick Cr and 500 nm thick Au; the ohmic electrode 309 may be a metal layer obtained by sequentially vapor-depositing AuGe/Ni/Au; and the pad electrode 305 may be a metal layer consisting of 100 nm thick Ti and 1.5 μm thick Au located on the Ti.

For the semiconductor light emitting diode 300 having such a layer structure, the light transmitting insulating layer 306 serves as a current blocking layer, so that light emission right under the pad can be prevented and also the light emitted from the periphery of the pad toward the pad electrode 305 is reflected by the reflective layer 307. Moreover, the light transmitting insulating layer 306 is disposed between the reflective layer 307 and the semiconductor layer 304, so that impurities can be prevented from diffusing from the semiconductor layer 304 into the reflective layer 307. Thus, the semiconductor light emitting diode 300 has a favorable layer structure in terms of minimizing the influence of light blocking due to the pad electrode 305, and improving the power output.

However, such a semiconductor light emitting diode 300 was found to have a problem in that peeling is likely to occur at a pad portion when an Au wire is bonded to the pad electrode 305, since the light emitting diode is fed through an LED chip. Specifically, peeling would occur at the pad portion or peeling is potentially likely to occur even if peeling does not actually occur in wire bonding; thus, such a semiconductor light emitting diode was found to have a problem in terms of mechanical reliability at the pad portion during wire bonding, for example, peeling occurs or otherwise the shear strength is degraded during a ball shear test for examining the bonding strength of the wire.

Given these circumstances, considering the above problems, an object of the present invention is to provide a semiconductor light emitting diode capable of suppressing peeling at a pad portion during wire bonding while maintaining the improvement in the output of the light emitting diode due to a reflective layer and a light transmitting insulating layer provided right under the pad. It is another object of the present invention to provide a method of manufacturing the same.

Solution to Problem

In order to achieve the objects, the inventors made further studies to find the above described pad portion tends to peel at the reflective layer 307/light transmitting insulating layer 306 and at the light transmitting insulating layer 306/semiconductor layer 304 interface. This is attributed to the following reasons. The adhesion at the reflective layer 307/light transmitting insulating layer 306 interface and the light transmitting insulating layer 306/semiconductor layer 304 interface is due to so called Van der Waals force, and such interfaces have lower adhesion as compared with interfaces involving exchange of electric charges and interdiffusion of atoms. The pad electrode 305 and the reflective layer 307 are deformed due to the load applied when a capillary is pressed against the pad electrode 305 in wire bonding, and the mechanical and thermal stresses caused by ultrasonic waves applied to weld the Au wire to the pad electrode 305; thus, the stresses are propagated to layers under the pad electrode 305. Therefore, it is conceivable that peeling is likely to start at the above interfaces having low adhesion.

Based on the above findings, the inventors conceived that when a hard film which is relatively hard is formed to a relatively large thickness between a reflective layer and a pad electrode in the semiconductor light emitting diode having the above layer structure, although the pad electrode is deformed in wire bonding, propagation of stresses to layers having low adhesion to each other would be suppressed by virtue of the hard film suppressing deformation. This hard film can suppress propagation of stresses caused by wire bonding, which makes peeling caused by wire bonding less likely to occur on and under the light transmitting insulating film. The present inventors actually tried a semiconductor light emitting diode provided with a relatively thick hard film, peeling of a pad portion was suppressed during wire bonding or at a ball shear test, and high shear strength was obtained in the ball shear test. Thus, they completed the present invention.

Consequently, in view of the above objects, the present invention primarily includes the following components.

(1) A semiconductor light emitting diode having a semiconductor layer including a light emitting portion, and a pad electrode located on the semiconductor layer, comprising: between the semiconductor layer and the pad electrode, a reflective portion including a light transmitting insulating layer serving as a current blocking layer located on the semiconductor layer, and a reflective layer located on the light transmitting insulating layer; a contact portion formed from an ohmic electrode in contact with the reflective portion, located on the semiconductor layer; and a conductive hard film between the reflective layer and the pad electrode, wherein the conductive hard film has $HV \times t > 630$, where Vickers hardness is HV (Hv) and the thickness is t (μm).

(2) The semiconductor light emitting diode according to (1) above, wherein the conductive hard film has a Vickers hardness HV higher than both of the Vickers hardnesses of the pad electrode and the reflective layer.

(3) The semiconductor light emitting diode according to (1) or (2) above, wherein the conductive hard film has a Vickers hardness HV of 600 Hv or more.

(4) The semiconductor light emitting diode according to any one of (1) to (3) above, wherein the conductive hard film has a thickness t of 0.3 μm or more.

(5) The semiconductor light emitting diode according to any one of (1) to (4) above, wherein the conductive hard film has a thickness t of 2 μm or less.

(6) The semiconductor light emitting diode according to any one of (1) to (5) above, wherein the conductive hard film is made of any one of Ti, Ta, Cr, W, Mo, and V alone or a nitride thereof.

(7) The semiconductor light emitting diode according to any one of (1) to (6) above, wherein a voltage drop during supply of a current to the conductive hard film is equal to or less than the threshold voltage of the semiconductor layer.

(8) The semiconductor light emitting diode according to any one of (1) to (7) above, wherein the conductive hard film entirely covers the reflective layer and at least a part of the ohmic electrode.

(9) The semiconductor light emitting diode according to any one of (1) to (8) above, wherein the ohmic electrode is formed to surround the reflective portion.

(10) A method of manufacturing a semiconductor light emitting diode comprising a semiconductor layer including a light emitting portion, and a pad electrode located on the semiconductor layer, comprising the steps of: forming the semiconductor layer; forming a contact portion consisting of an ohmic electrode having a predetermined pattern on the semiconductor layer; forming a light transmitting insulating layer as a current blocking layer on the semiconductor layer, and forming a reflective layer on the light transmitting insulating layer, thereby forming a reflective portion in contact with the contact portion; forming a conductive hard film of $HV \times t > 630$ on the reflective layer, where the Vickers hardness is HV (Hv) and the thickness is t (μm); and forming the pad electrode on the conductive hard film.

Advantageous Effect of Invention

According to the present invention, a conductive hard film satisfying $HV \, t > 630$, where HV refers to Vickers hardness (Hv) and t refers to thickness×(μm), is disposed between a reflective layer and a pad electrode. Thus, the above described operations make it possible to suppress peeling of a pad portion during wire bonding while maintaining the improvement in the output of the light emitting diode due to a reflective layer and a light transmitting insulating layer provided right under the pad.

DESCRIPTION OF EMBODIMENTS

The present invention will be described below in more detail with reference to the accompanying drawings. Note that in this specification, components that are common to semiconductor light emitting diodes according to the present invention and semiconductor light emitting diodes of comparative examples are denoted by reference numerals having the same two last digits in principle, and thus their descriptions will be omitted. In addition, layers in the schematic cross-sectional views of light emitting diodes are enlarged for the sake of explanation; accordingly, the ratios of the layers do not conform to the actual ratios.

(Semiconductor Light Emitting Diode 100)

Figure 1:
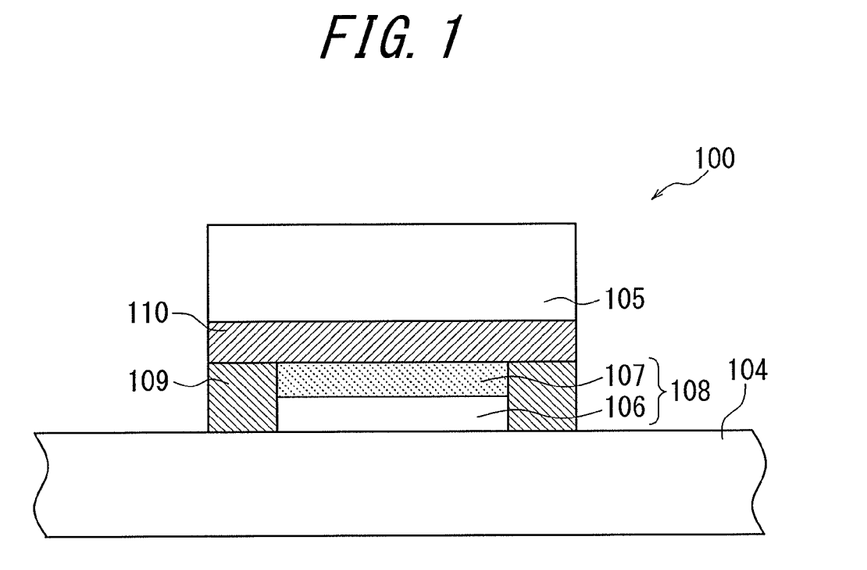
FIG. 1 is a schematic cross-sectional view showing a semiconductor light emitting diode 100 according to the present invention, in which a pad portion is magnified.

A semiconductor light emitting diode 100 of an embodiment of the present invention has a semiconductor layer 104 including a light emitting portion, and a pad electrode 105 located on the semiconductor layer 104 as shown in FIG. 1. The semiconductor light emitting diode 100 has a reflective portion 108 and an ohmic electrode (contact portion) 109 between the semiconductor layer 104 and the pad electrode 105. The reflective portion 108 includes a light transmitting insulating layer 106 as a current blocking layer disposed on the semiconductor layer 104, and a reflective layer 107 disposed on the light transmitting insulating layer. The contact portion is located on the semiconductor layer 104 and consists of an ohmic electrode 109 in contact with the reflective portion 108. Here, the semiconductor light emitting diode 100 characteristically has a conductive hard film 110 of HV×t>630, where HV refers to Vickers hardness (Hv) and t refers to thickness (μm), between the reflective layer 107 and the pad electrode 105. With such a structure, deformation of the conductive hard film 110 is suppressed even if the pad electrode 105 is deformed by pressing the conductive hard film 110 against the pad electrode 105 in wire bonding. Therefore, peeling can be suppressed at the reflective layer 107/light transmitting insulating layer 106 interface and the light transmitting insulating layer 106/semiconductor layer 104 interface which have low adhesion. Meanwhile, the semiconductor light emitting diode 100 can minimize light blocked by the pad electrode 105 as with the semiconductor light emitting diode 300 of FIG. 4(b).

The layer structure of the semiconductor light emitting diode 100 will be described in more detail with reference to FIGS. 2(a) and 2(b). The semiconductor light emitting diode 100 has a support substrate 115, a metal bonding layer 114 located on the support substrate 115, a reflective layer 113 located on the metal bonding layer 114, a composite layer of an ohmic electrode 111 and an insulating film 112, located on the reflective layer 113, and a semiconductor layer 104 including a p-type semiconductor layer 103 as a second conductivity semiconductor layer, a light emitting layer (light emitting portion) 102, and an n-type semiconductor layer 101 as a first conductivity semiconductor layer, located on the composite layer. On the rear surface of the support substrate 115 (where the semiconductor layer 104 is not stacked), a lower electrode 116 is formed. The semiconductor light emitting diode 100 is a wafer bonded LED device having the metal bonding layer 114, and the manufacturing process of this device will be described later. On the n-type semiconductor layer of the semiconductor layer 104, the pad portion described with reference to FIG. 1 is formed. Light is extracted from the semiconductor light emitting diode 100 through the pad electrode 105 (in the upward direction in FIG. 2(a)).

Figure 2:
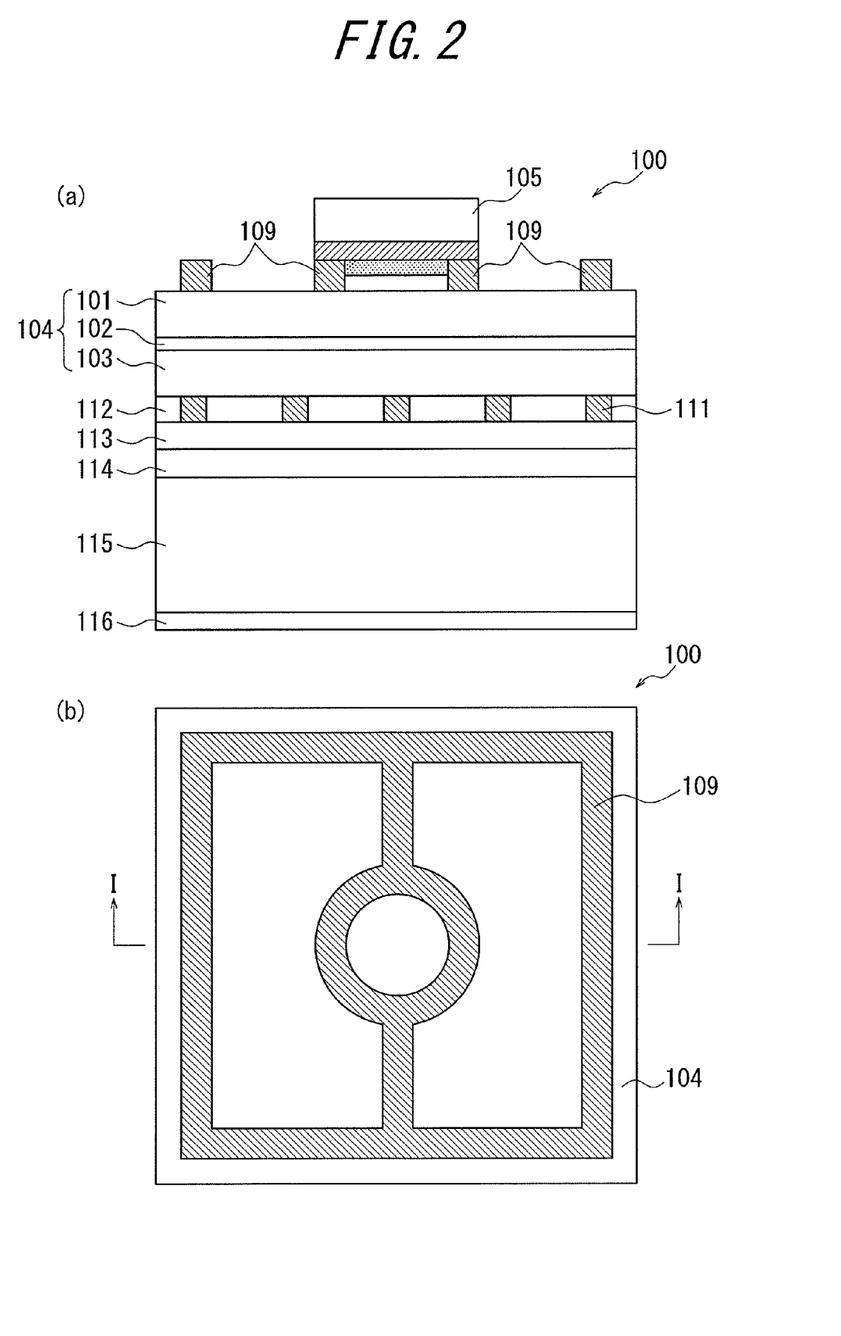
FIG. 2(a) is a schematic cross-sectional view showing a semiconductor light emitting diode 100 according to the present invention.
FIG. 2(b) is a top view illustrating the arrangement of an ohmic electrode in the semiconductor light emitting diode 100 of FIG. 2(a), from which a pad electrode 105 and a conductive hard film 110 are removed.

The ohmic electrode 109 of the semiconductor light emitting diode 100 is formed to have a shape shown in FIG. 2(b) when viewed from above, and the reflective portion 108 consisting of the light transmitting insulating film 106 and the reflective layer 107 is formed inside a circular electrode at the center. Further, as seen in FIGS. 2(a) and 2(b), the circular electrode portion of the ohmic electrode 109 is formed to contact and surround the light transmitting insulating film 106 and the reflective layer 107. Thus, an opening formed of the ohmic electrode 109 is provided right under the pad electrode 105, and the reflective portion 108 is provided in the opening on the semiconductor layer 104. Such a structure is deemed to be favorable in terms of the fact that the side surface of the reflective portion 108 is covered with the ohmic electrode 109, and the perimeter of the reflective portion with less adhesion will be protected from external forces applied via the side surface in later steps. Further, the conductive hard film 110 is formed to entirely cover the reflective portion 108 (the reflective layer 107, to be more exact) and to cover at least a part of the ohmic electrode 109 (the circular electrode portion at the center, in this embodiment). The conductive hard film 110 entirely covers the reflective layer 107 as described above, which makes it possible to more effectively suppress peeling of the pad portion by more reliably reducing the stresses due to pressing in wire bonding.

Examples of suitable materials for forming the support substrate 115 include, for example, a semiconductor material such as Si, GaAs, or Ge; a metal such as Al or Cu; or an alloy material thereof, and the support substrate 115 preferably has a thickness of 100 μm to 300 μm.

Examples of suitable materials for forming the metal bonding layer 114 include, for example Au, and the the metal bonding layer 114 preferably has a thickness of 0.5 μm to 3.0 μm.

The reflective layer 113 reflects part of light emitted from the light emitting layer 102 toward the support substrate 115 side, thereby increasing the light extraction efficiency. The reflective layer desirably has high reflectance for the dominant wavelength of the light emitted from the light emitting layer 102, and preferably has a reflectance of 60% or more for light in a wavelength range of 600 nm to 950 nm. Examples of suitable materials for forming the reflective layer 113 include gold (Au), aluminum (Al), or silver (Ag) alone; an alloy using any one of them as a component element; or a laminate thereof; and the like, and the reflective layer 113 preferably has a thickness of 100 nm to 1000 nm. Gold (Au) and silver (Ag) generally have low adhesion to insulators, so that they easily peel off as they are. In this regard, it is known that the adhesion can be improved by providing an adhesion layer of Cr, Ti, Mo, or the like between them. It should be note that such an adhesion layer has low reflectance, so that the layer should have a small thickness of for example around 10 nm so as to transmit light.

The ohmic electrode 111 is an electrode for forming a good ohmic contact with the second conductivity semiconductor layer 103 (p-type semiconductor layer in this embodiment). Examples of suitable materials for forming the ohmic electrode 111 include, for example, AuZn and AuBe. The ohmic electrode 111 preferably has a thickness of 100 nm to 500 nm.

The material of the insulating film 112 is not limited in particular as long as the insulating film 112 can transmit and guide the light emitted from the light emitting layer 102 to the reflective layer 113. The insulating film 112 desirably has high transmittance for the dominant wavelength of the light emitted from an active layer (light emitting layer), and preferably has a transmittance of 80% or more for light in a wavelength range of 600 nm to 950 nm. Examples of suitable materials of the insulating film 112 include, for example, SiN, $SiO_2$, and MN. The insulating film 112 preferably has a thickness of 100 nm to 500 nm.

Examples of suitable materials for forming the layers in the semiconductor layer 104 include a compound semiconductor, for example, Group III-V compound semiconductors. For the group III-V compound semiconductors, for example, the n-type semiconductor layer 101 and the p-type semiconductor layer 103 may be each made of an AlGaAs-based material, an AlGaInP-based material, or an AlGaN-based material. P-type impurities can be Mg, Zn, and C, for example, whereas n-type impurities can be Si, Te, and Se, for example. The light emitting layer 102 may have a single layer structure or a layered structure such as a multiple quantum well structure, made from an AlGaAs-based material, an AlGaAsInP-based material, an AlGaN-based material, or the like. Both of them can be formed by epitaxial growth using a known method such as MOCVD. The emission wavelength of the light emitting layer can be in the range of 600 nm to 950 nm. For the thicknesses of the layers, for example, the n-type semiconductor layer 101 may be 1 μm to 10 μm, the light emitting layer 102 may be 10 nm to 500 nm, and the p-type semiconductor layer 103 may be 1 μm to 10 μm, in thickness. It should be noted that in the description of the present invention, but without limitation, the semiconductor layer 104 has been described on the basis that the first conductivity type is n-type and the second conductivity type is p-type. Alternatively, the first conductivity type and the second conductivity type can naturally be p-type and n-type, respectively in the present invention.

The ohmic electrode 109 is an electrode for forming a good ohmic contact with the first conductivity semiconductor layer 101 (n-type semiconductor layer in this embodiment). Examples of suitable materials for forming the ohmic electrode 109 include, for example, an AuGe/Ni/Au electrode in which AuGe, Ni, and Au are sequentially stacked. The ohmic electrode 109 preferably has a thickness of 100 nm to 1000 nm.

The material of the light transmitting insulating layer 106 is not limited in particular as long as the light transmitting insulating layer 106 can transmit and guide the light emitted from the light emitting layer 102 to the reflective layer 107. The light transmitting insulating layer 106 serves as a current blocking layer between the semiconductor layer 104 and the pad electrode 105. Accordingly, the light transmitting insulating layer 106 is preferably provided to include at least the center region of a portion right under the pad electrode 105. The light transmitting insulating layer 106 preferably has a transmittance of 80% or more for light in a wavelength range of 600 nm to 950 nm. Examples of suitable materials of the light transmitting insulating layer 106 include, for example, SiN, $SiO_2$, and AlN. The light transmitting insulating layer 106 preferably has a thickness of 100 nm to 500 nm.

The reflective layer 107 reflects part of light emitted from the light emitting layer 102 toward the pad electrode 105, thereby increasing the light extraction efficiency. The reflective layer 107 preferably has a reflectance of 60% or more for light in a wavelength range of 600 nm to 950 nm. Examples of suitable materials for forming the reflective layer 107 include, for example, gold (Au), a gold alloy material, platinum (Pt), aluminum (Al), or silver (Ag) alone; an alloy using any one of them as a component element; or a laminate thereof. For a near-infrared wavelength region, a Cr/Au electrode can be given as a favorable example, in which Au having a reflectance of 90% for light in the relevant region is disposed on a thin Cr adhesion layer. Preferably, the Cr layer which is an adhesive member has a thickness of 5 nm to 20 nm, whereas the Au layer which is a reflective member has a thickness of 100 nm to 1000 nm. Such a material normally has a Vickers hardness in the range of 100 Hv or less.

The conductive hard film 110 which is a characteristic feature of the present invention satisfies HV×t>630, where HV refers to Vickers hardness (Hv), and t refers to thickness (μm). Therefore, even when stresses are applied to the pad electrode 105 during wire bonding, the conductive hard film 110 is hardly deformed and reduces the stresses, thereby suppressing subsequent propagation of the bonding stresses to the reflective layer 107, the light transmitting insulating layer 106, and the semiconductor layer 104. Accordingly, in terms of deformation due to stresses, it is conceivable that the effect of suppressing propagation of stresses is more significant as the Vickers hardness of the conductive hard film 110 is higher and the thickness thereof is larger. Introducing a concept of [Vickers hardness]×[thickness], the inventors found a necessary condition for suppressing peeling of a pad portion resulted from wire bonding of [Vickers hardness]×[thickness]>630 Hv·μm, by analysis. In terms of more reliably obtaining the advantageous effects of the present invention, HV×t>700 is preferable, and HV×t≥1000 is more preferable. Note that Vickers hardness in the present invention is measured by a measurement method in accordance with JIS Z 2244. The conductive hard film is a thin film that is several micrometers or thinner in thickness. The Vickers hardness of the thin film is measured with an ultra micro hardness tester (MHA-400, manufactured by NEC), using the value of the Vickers hardness HV of a known sample based on the foregoing JIS specification as a reference. For reference purposes, representative documents referring to Vickers hardness are shown below as examples.

Handbook of refractory carbides and nitrides: properties, characteristics, processing and applications/Hugh O. Pierson (1996)

Metals Handbook: Properties and Selection: Nonferrous Alloys American Society for Metals, Metals Park, Ohio (1988)

In view of this effect of suppressing stress propagation, the conductive hard film 110 preferably has Vickers hardness HV higher than that of both the pad electrode 105 and the reflective layer 107.

Specifically, the conductive hard film 110 preferably has a Vickers hardness HV of 600 Hv or more, more preferably 1500 Hv or more, still more preferably 2000 Hv or more.

The conductive hard film 110 preferably has a thickness t of 0.3 μm or more, more preferably 0.5 μm or more. These conditions further ensure the sufficient effect of suppressing stress propagation of the present invention.

Further, the conductive hard film 110 preferably has a thickness t of 2 μm or less, more preferably 1 μm or less. A thickness t of more than 2 μm has adverse effects in terms of cost and workability, increases resistance of the whole electrode, and increases the forward voltage value.

Note that in the method of measuring film thicknesses in this specification, a stylus profilometer is used, and a film thickness is found from the mean value of the measured values of five points in the wafer surface (in the case of a 3-inch substrate in this embodiment, the five points are on a diagonal line passing through the wafer center and the points are provided at a regular interval such that two of the points are end points at positions 1 cm inside from the perimeter of the wafer, and the rest are between the two points).

Further, when the semiconductor light emitting diode 100 has a structure in which a current is supplied through the conductive hard film 110, the conductive hard film 110 preferably has low resistance. For example, a voltage drop in the supply of the current to the conductive hard film 110 is preferably equal to or lower than the threshold voltage of the semiconductor layer 104. More preferably, the resistivity of the conductive hard film 110 at 20° C. is $10^{-5}$ Ω·m or lower, still more preferably, $10^{-6}$ Ω·m or lower. Note that the voltage drop $Vd_h(V)$ during the supply of the current to the conductive hard film can be easily determined as follows, when the supplied current is a DC current.

$$Vd_h=(\rho_h \times t_h/S_h) \times I$$

$\rho_h$: Resistivity ($\Omega \cdot$m) of conductive hard film
$t_h$: Thickness (m) of conductive hard film
$S_h$: Area (m$^2$) of conductive hard film
I: Supplied current (A)

The supplied current is limited to a reasonable range, for example, equal to or lower than the rated current of the LED device. Further, the threshold voltage of the semiconductor layer is ideally determined from the current-voltage characteristics of the LED device; however, actual LED devices are influenced by parasitic resistance and the like. Therefore, "threshold voltage" is herein defined simply as a value obtained by dividing the energy of light corresponding to the dominant emission wavelength by electric charge q.

Specific examples of the material of the conductive hard film 110 include any one of Ti, Ta, Cr, W, Mo, and V alone and nitrides thereof, and more specific examples include TiN, Ta, TaN, WN, and the like. In particular, TiN is most preferable. TiN is a material easy to handle, since Ti is not only hard and electrically conductive, but also excellent in wet etching characteristics.

As shown in FIG. 1, the conductive hard film 110 is preferably provided between the pad electrode 105 and the ohmic electrode 109, thereby preventing direct contact between the pad electrode 105 and the ohmic electrode 109. Thus, impurities (for example, Ga, As, and Ge) can be prevented from diffusing into the pad electrode 105 from the ohmic electrode 109 and the semiconductor light emitting diode 100.

Examples of suitable materials of the top surface forming the pad electrode 105 include Al and Au materials used for welding of Au wires. The pad electrode 105 is preferably a Ti/Au electrode obtained by sequentially forming Au on Ti serving as an adhesion layer. The Ti layer has a thickness of 50 nm to 200 nm so as to function as an adhesion layer. The Au layer preferably has a thickness of 1 μm to 3 μm. The Ti layer typically has a Vickers hardness in the range of 70 Hv to 250 Hv, whereas the Au layer typically has a Vickers hardness in the range of 20 Hv to 30 Hv.

The material of the lower electrode 116 is selected from materials forming an ohmic contact with the support substrate 115. For example, when n-type GaAs is selected for the support substrate, a laminate of AuGe/Ni/Au can be selected for the lower electrode 116. When a metal substrate is used as the support substrate 115, a structure without a lower electrode can also be selected.

(Method of Manufacturing Semiconductor Light Emitting Diode 100)

Figure 3:
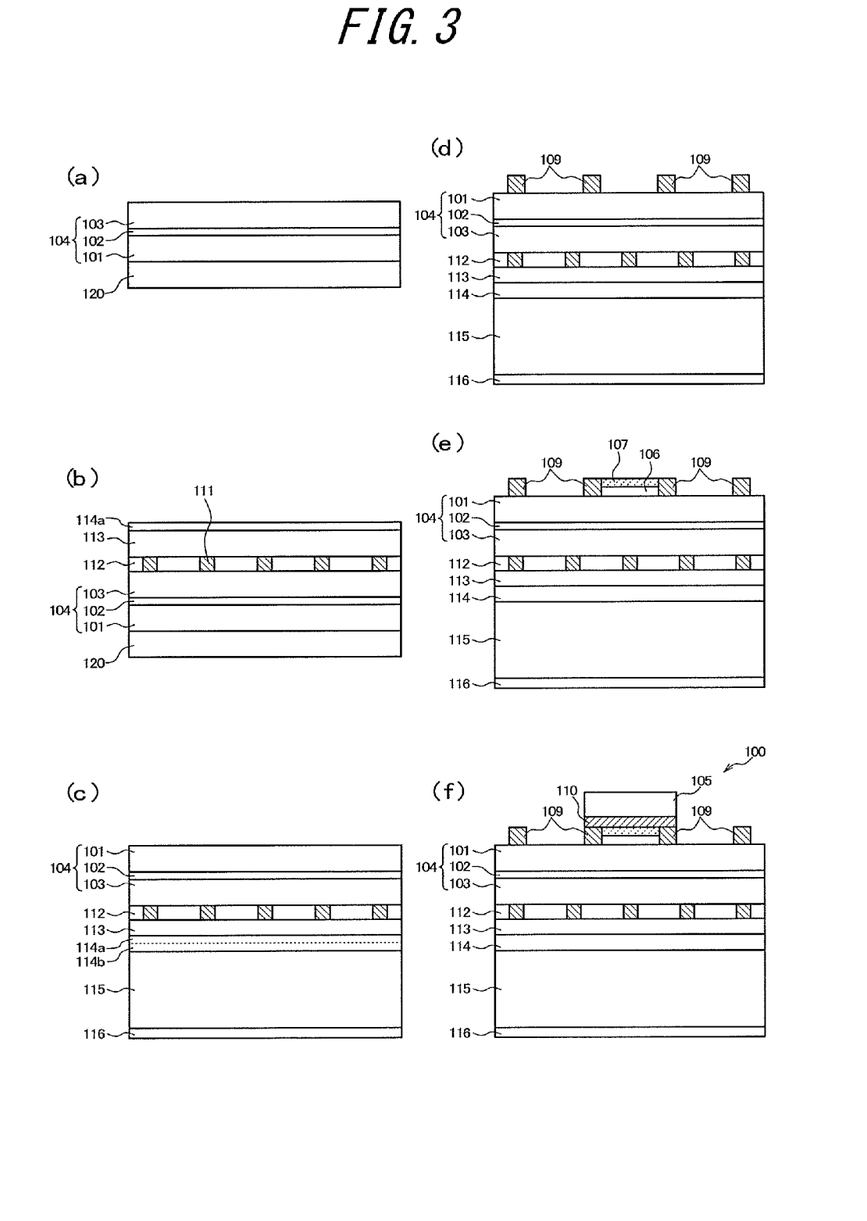
FIGS. 3(a) to 3(f) are schematic cross-sectional views showing an example of a semiconductor light emitting diode 100 according to the present invention.

Next, an example of a method of manufacturing a semiconductor light emitting diode 100 will be described with reference to FIGS. 3(a) to 3(f). First, as shown in FIG. 3(a), a semiconductor layer 104 is formed on a growth substrate 120 such as a GaAs substrate. The semiconductor layer 104 is formed by epitaxially growing an n-type semiconductor layer 101, a light emitting layer 102, and a p-type semiconductor layer 103 that are made of materials as described above, in this order, for example, by MOCVD.

Next, as shown in FIG. 3(b), an ohmic electrode 111 having a predetermined pattern is formed on the semiconductor layer 104. For example, the materials described above are deposited by a vapor deposition method using resistance heating or electron beam deposition, and a resist pattern is formed thereon by photolithography. The deposited film is then etched to form the predetermined pattern. Subsequently the film is subjected to contact annealing (RTA: Rapid Thermal Annealing). After that, an insulating film 112 is formed on part of the semiconductor layer 104 on which the ohmic electrode is not formed. This structure can be obtained by forming, for example, the above materials by plasma-enhanced CVD, sputtering, or the like. After that, a resist pattern having an opening only at the ohmic electrode portions is formed, and the ohmic electrode portions are wet etched using a certain etchant, thereby forming openings allowing for current flow in the insulating film. A reflective layer 113 is then formed, for example, by sputtering or the like. For example, Au or the like is formed as a first metal bonding layer 114a (bonding layer on the semiconductor layer side) on the reflective layer 113 by a method such as vapor deposition.

Next, as shown in FIG. 3(c), a support substrate 115 on the rear surface of which is provided with a lower electrode 116 while the surface of which is provided with a first metal bonding layer 114b (bonding layer on the support substrate side) is bonded to the substrate shown in FIG. 3(b). Specifically, the first metal bonding layer 114a and the second metal bonding layer 114b are bonded and heated; thus, both of the substrates are bonded to each other in the metal bonding layer 114. Note that the second metal bonding layer 114b can be formed on the support substrate 115 by a similar method as the first metal bonding layer 114a. The lower electrode 116 is formed on the support substrate 115, for example by sputtering or electron beam deposition, using a material described above.

After that, the growth substrate 120 is ground, and further etched to remove the growth substrate 120.

Next, as shown in FIG. 3(d), a contact portion formed from the ohmic electrode 109 having a predetermined pattern is formed on the semiconductor layer 104. For example, the materials described above are deposited for example by a vapor deposition method using resistance heating, and a resist pattern is formed thereon by photolithography. The deposited film is then etched to form a predetermined pattern. Subsequently the film is subjected to contact annealing (RTA: Rapid Thermal Annealing). It should be noted that "vapor deposition using resistance heating" herein refers to a method in which vapor deposition is performed by heating of a metal under vacuum and subsequent evaporation thereof. In this method, in order to heat the metal to be vapor deposited, a current is applied to a stage made of a material having a high melting point (for example, a wire or a boat made of tungsten), thereby heating the stage to a high temperature with the heat produced by metal resistance.

Next, as shown in FIG. 3(e), a light transmitting insulating layer 106 is formed as a current blocking layer on the semiconductor layer 104, and a reflective portion 108 is formed in contact with a contact portion 109 by forming a reflective layer 107 on the light transmitting insulating layer 106. Specifically, a resist pattern having an opening only at a portion corresponding to the portion inner than the circular electrode at the center of the ohmic electrode 109 is formed by photolithography; the light transmitting insulating film 106 is deposited by sputtering, plasma-enhanced CVD, or the like; and the reflective layer 107 is deposited by sputtering, electron beam deposition, vapor deposition by resistance heating, or the like. After that, parts of the insulating film and the reflective layer with the remnant resist are removed by lift-off.

Next, as shown in FIG. 3(f), a conductive hard film 110 is formed on the reflective layer 107. Specifically, a resist pattern having an opening only on the reflective layer 107 and the circular electrode portion at the center of the ohmic electrode 109 is formed by photolithography and a conductive hard film 110 is formed thereon by sputtering or the like. Further, a pad electrode 105 is formed on the conductive hard film 110, for example, by sputtering, electron beam deposition, vapor deposition by resistance heating, or the like. After that, parts of the conductive hard film and the pad electrode with remnant resist are removed by lift-off.

Finally, after forming a mesa pattern, dicing is performed thus completing an LED device using the semiconductor light emitting diode 100.

The semiconductor light emitting diode 100 which is a wafer bonded LED device and a manufacturing method thereof have been heretofore described as embodiments of the present invention; however, the present invention is not limited to wafer bonded LED devices. Further, each of the above embodiments is only an example of representative embodiments, and the present invention is not limited to those embodiments. The present invention will be described below in more detail using examples. However, the present invention is not limited to the following examples.

EXAMPLES

Example 1

A semiconductor light emitting diode according to the present invention was fabricated by a method shown in FIGS. 3(a) to 3(f). First, a semiconductor layer consisting of an n-type semiconductor layer (thickness: 7.5 μm, AlGaAs material), a light emitting layer (total thickness: 50 nm, AlGaInAs material), and a p-type semiconductor layer (thickness: 2 μm AlGaAs material) were formed on a growth substrate made of GaAs by MOCVD. Next, AuZn (thickness: 200 nm) was deposited on the p-type semiconductor layer by vapor deposition using resistance heating, was patterned by photolithography, and was subjected to contact annealing at 420° C., thereby forming an ohmic electrode. After that, an insulating film made of SiN was formed by plasma-enhanced CVD on part of the p-type semiconductor layer where the ohmic electrode is not formed. Subsequently, a reflective layer (thickness: 750 nm, Au material) was formed by electron beam deposition. Further, Ti/Au (thickness: 100 nm/1 μm) was deposited thereon as a bonding layer on the semiconductor layer side by vapor deposition.

In addition to the above, ohmic electrodes (thickness: 200 nm, AuGe/Ni/Au material) was formed on both surfaces of a support substrate made of a GaAs material by vapor deposition by resistance heating. One of the ohmic electrodes was formed as a lower electrode, and Ti/Au (thickness: 100 nm/1 μm) was deposited as a bonding layer on the support substrate side on the surface provided with the other ohmic electrode by electron beam deposition. The bonding layer on the semiconductor layer side and the bonding layer on the support substrate side were attached to each other and heated at 400° C. for 30 min, thereby bonding them together. After that, the growth substrate was ground to be thin, and then etched with an etchant containing ammonia, a hydrogen peroxide solution, and water. Thus, the growth substrate was completely removed.

Next, AuGe/Ni/Au (thickness: 90 nm/15 nm/600 nm) was deposited by vapor deposition using resistance heating on the n-type semiconductor layer exposed by the removal of the growth substrate, patterned into a doughnut shape having an outer diameter of 120 μm and an inner diameter of 90 μm by photolithography, and subjected to contact annealing at 420° C., thereby forming an ohmic electrode. After that, a resist was formed on this ohmic electrode other than the circular opening having an inner diameter of 90 μm at the center in which the n-type semiconductor layer is exposed, and a light transmitting insulating film (thickness: 100 nm, AlN material) was formed by sputtering. On the light transmitting insulating film, a reflective layer (thickness: 10 nm/500 nm, Cr/Au material) was then formed by electron beam deposition. Subsequently, the light transmitting insulating film and the reflective layer were formed in the opening of the ohmic electrode using a lift-off method. Next, a resist was formed thereon except for the surface of the portion including the reflective layer and the ohmic electrode which has the diameter of 120 μm. Using a sputtering system SPC-350 (manufactured by ANELVA, DC magnetron, power output: 100 W), a pure Ti target (purity: 3 N, manufactured by Kojundo Chemical Lab. Co., Ltd.) was sputtered at room temperature in an Ar gas atmosphere containing nitrogen gas (N2: 0.9 sccm, Ar: 36 sccm), thereby forming a conductive hard film (thickness t: 0.50 μm, TiN material). The deposited TiN was analyzed by ESCA (Electron Spectroscopy for Chemical Analysis) and was found to be a gold colored TiN film having a Ti:N ratio of 1:1. After that, a pad electrode (thickness: 100 nm/1.5 μm, Ti/Au material) was further formed by electron beam deposition. A lift-off method was then performed to form the pad electrode. Finally, after patterning by photolithography, etching was performed using a mixed solution of phosphoric acid and a hydrogen peroxide solution to form a mesa pattern, and dicing was performed to complete a semiconductor light emitting diode (LED device) according to the present invention. Note that the emission wavelength of this LED device was 850 nm.

The Vickers hardness HV of TiN that is a conductive hard film was 2100 Hv; accordingly, HV×t=1050 (>630). Further, the Vickers hardnesses of the pad electrode and the reflective layer were 22 Hv each.

Example 2

A semiconductor light emitting diode according to the present invention was fabricated by the same method as Example 1 except that the thickness of TiN that is the conductive hard film was 0.75 μm, where HV×t=1575.

Example 3

A semiconductor light emitting diode according to the present invention was fabricated by the same method as Example 1 except that the thickness of TiN that is the conductive hard film was 1.00 μm, where HV×t=2100.

Example 4

A semiconductor light emitting diode according to the present invention was fabricated by the same method as Example 1 except that sputtering was performed in an Ar atmosphere at room temperature using a target of pure tungsten (W) target (purity: 3 N, manufactured by Kojundo Chemical Lab. Co., Ltd.) instead of Ti, and the pure W film having a thickness of 2.00 μm was used as the conductive hard film. The Vickers hardness HV of tungsten is 350 Hv; accordingly, HV×t=700.

Comparative Example 1

A semiconductor light emitting diode 200 including a pad portion having a layer structure shown in FIG. 4(a) was fabricated by the same method as Example 1 except that the light transmitting insulating layer, the reflective layer, and the conductive hard film were not formed. In the semiconductor device 200, an ohmic electrode 209 was made of a circular electrode (AuGe/Ni/Au material) without an opening on a semiconductor layer 204, and a pad electrode 205 was formed.

Comparative Example 2

A semiconductor light emitting diode 300 including a pad portion having a layer structure shown in FIG. 4(b) was fabricated by the same method as Example 1 except that the conductive hard film was not formed. In the semiconductor light emitting diode 300, a reflective portion including a light transmitting insulating layer 306 and a reflective layer 307, and a contact portion formed from an ohmic electrode 309 were formed on a semiconductor layer 304, and a pad electrode 305 was formed without forming a conductive hard film.

Comparative Example 3

A semiconductor light emitting diode 400 including a pad portion having a layer structure shown in FIG. 4(c) was fabricated by the same method as Example 1 except that Pt was deposited to a thickness of 1.00 μm instead of TiN that is the conductive hard film by electron beam deposition. In the semiconductor light emitting diode 400, a reflective portion including a light transmitting insulating layer 406 and a reflective layer 407, and a contact portion formed from an ohmic electrode 409 were formed on a semiconductor layer 404, and a pad electrode 405 was formed after forming a Pt film 410. The Vickers hardness of Pt is 41 Hv; accordingly, HV×t=41.

Comparative Example 4

A semiconductor light emitting diode according to the present invention was fabricated by the same method as Example 1 except that tungsten (W) is deposited to a thickness of 1.00 μm as the conductive hard film of Example 1, where HV×t=350.

Comparative Example 5

A semiconductor light emitting diode was fabricated by the same method as Example 1 except that the thickness of TiN that is the conductive hard film was 0.10 μm. The Vickers hardness HV of TiN is 2100 Hv; accordingly, HV×t=210.

Comparative Example 6

A semiconductor light emitting diode was fabricated by the same method as Example 1 except that the thickness of TiN that is the conductive hard film was 0.30 μm, where HV×t=630.

REFERENCE EXAMPLES

In additional Reference Examples, in order to analyze the boundary value of HV×t, a device was formed in which a Si film was deposited as a hard film having a Vickers hardness in between those of W and TiN. Since the deposited Si film has a semi-insulating property, this film is not relevant to the "conductive hard film" in the claims. Therefore, the analysis was conducted only for confirming the effect of preventing peeling. Si was deposited at a rate of 10 angstrom/sec (1 nm/s) by electron beam deposition. The deposition was started at a degree of vacuum of 1.0E-4 (Pa) and the substrate temperature was 25° C. to 35° C. during the deposition. The Vickers hardness of the deposited Si film was measured with an ultra micro hardness tester to be HV=1150.

Reference Example 1

A semiconductor light emitting diode was fabricated by the same method as Example 1 except that Si was deposited by electron beam deposition to a thickness of 0.4 μm instead of TiN that is the conductive hard film, where HV×t=460.

Reference Example 2

A semiconductor light emitting diode was fabricated by the same method as Example 1 except that Si was deposited by electron beam deposition to a thickness of 0.6 μm instead of TiN that is the conductive hard film, where HV×t=690.

Reference Example 3

A semiconductor light emitting diode was fabricated by the same method as Example 1 except that Si was deposited by electron beam deposition to a thickness of 0.8 μm instead of TiN that is the conductive hard film, where HV×t=920.

(Evaluation Method)

Twenty samples of semiconductor light emitting diodes were fabricated according to each of Examples 1 to 4, Comparative Examples 1 to 6, and Reference Examples 1 to 3, and wire bonding was performed on each of the samples.

In wire bonding, an Au wire was passed through a capillary and the Au wire was heated to be agglomerated and curled to form a ball at the tip of the capillary. Further, this ball was pressed against the pad electrode while applying loading capacity and ultrasonic waves to the ball, thereby bonding the Au wire to the pad electrode. An Au wire having a diameter of 25 μm was bonded using a wire bonder (MODEL-7700D, manufactured by WEST-BOND). The loading capacity was 0.7 N, the ultrasonic treatment duration was 60 ms, and the power output of the ultrasonic waves was 1.0 W. After the bonding, the rate of each sample with peeling at the pad portion was calculated in Examples and Comparative Examples. The results are shown as "Peeling rate after bonding" in Table 1.

Figure 5:
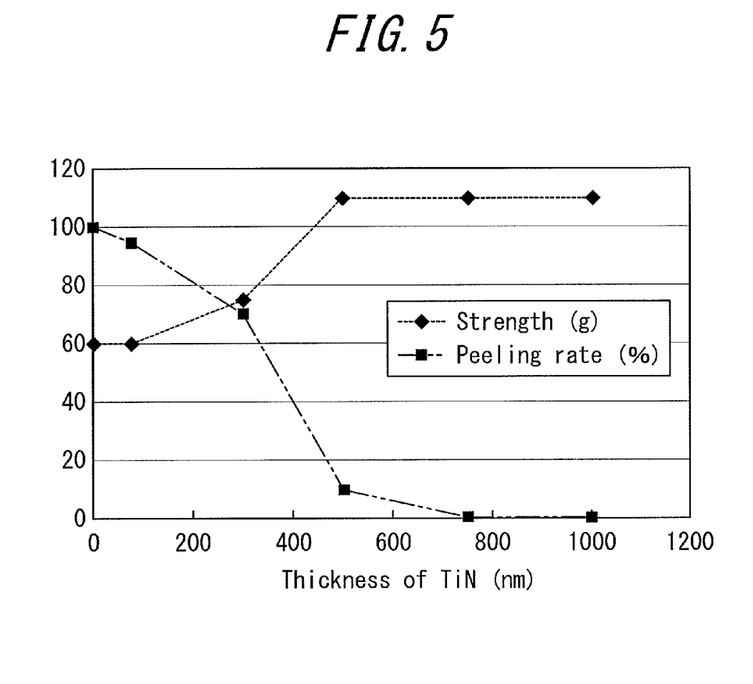
FIG. 5 is a graph showing the relationship between the film thickness of TiN serving as a conductive hard film 110 and the shear strength and peeling rate in a ball shear test in examples.

Twenty semiconductor light emitting diodes were each fabricated with an Au wire being bonded according to one of Examples, Comparative Examples, and Reference Examples, and each of the semiconductor light emitting diodes was subjected to a ball shear test. The ball shear test is a test in which an Au ball made at a portion where the Au wire is bonded to the pad electrode by wire bonding is sheared with a metal hook in the transverse direction, and the bonding strength is found from the loading capacity required for the shearing (ball shear strength). The measurement was carried out in accordance with the EIA/JESD22-B116 standard, "Wire Bond Shear Test Method". The test was carried out using a multipurpose shear tester (4000PXY, manufactured by DAGE) at a shear rate of 100 μm/s at a shear height of 10 μm. Note that the shear rate is a rate at which the hook is slid in the transverse direction, and the shear height means a height from the pad electrode surface to the tip of the hook. For each of Examples, Comparative Examples, and Reference Examples, the intermediate values of the ball shear strength of the 20 samples are shown as "ball shear strength" in Table 1. Further, after the test, the rate of samples with the pad portion peeling from the insulating film (peeling between the insulating layer and the semiconductor layer, between the insulating layer and the reflective layer, or at both locations)

was calculated with respect to each of Examples, Comparative Example, and Reference Examples. The results are shown as "Peeling rate after ball shear" in Table 1. Further, the ball shear strength and the peeling rate after ball shear in each of Comparative Example 2 (TiN=0 nm), Comparative Examples 5 and 6 (TiN=100 nm, 300 nm), and Examples 1 to 3 (TiN=500 nm, 750 nm, 1 μm) is plotted in the graph of FIG. 5.

The forward voltage Vf at a current of 20 mA supplied to each of the semiconductor light emitting diodes obtained in Examples and Comparative Examples using a constant current voltage power supply was measured, and the light output power Po thereof was measured using an integrating sphere. The intermediate value of the measurement results of 10 samples is shown in Table 1.

described above, when a conductive hard film which does not meet the requirements of the present invention is used, pad portions cannot have mechanical reliability sufficient for the products.

On the other hand, in Examples 1 to 4 and Reference Examples 2 and 3, in each of which the product of the Vickers hardness Hv and the thickness t was more than 630 Hv·μm, the peeling rate after bonding was 0%. Moreover, the peeling rate after ball shear test was lower and the ball shear strength was higher as compared with Comparative Examples 2 to 6. Thus, Examples 1 to 4 and Reference Examples 2 and 3 showed the results that the pad portions were hardly peeled. This is because W, Si, and TiN are materials having a high Vickers hardness of 350 Hv, 1150 Hv, and 2100 Hv, respectively, and are thick to have sufficient strength also for the film

TABLE 1

| | Samples | | | | Test results | | | | |
|---|---|---|---|---|---|---|---|---|---|
| | | Inserted film | | | Vickers hardness × Tchikness (Hv · μm) | Peeling rate after bonding (%) | Peeling rate after ball shear (%) | Ball shear strength (g) | Po (mW) | Vf (V) |
| | Sample structure | Material | Hv | Thickness (μm) | | | | | | |
| Comparative Example 1 | FIG. 4(a) | — | — | — | — | — | — | 110 | 6.5 | 1.47 |
| Comparative Example 2 | FIG. 4(b) | — | — | — | — | 5 | 100 | 60 | 7.5 | 1.50 |
| Comparative Example 3 | FIG. 4(c) | Pt | 41 | 1.00 | 41 | 0 | 90 | 70 | 7.5 | 1.50 |
| Comparative Example 4 | FIG. 1 | W | 350 | 1.00 | 350 | 0 | 80 | 75 | 7.5 | 1.50 |
| Comparative Example 5 | FIG. 1 | TiN | 2100 | 0.10 | 210 | 5 | 95 | 60 | 7.5 | 1.50 |
| Comparative Example 6 | FIG. 1 | TiN | 2100 | 0.30 | 630 | 0 | 70 | 75 | 7.5 | 1.50 |
| Example 1 | FIG. 1 | TiN | 2100 | 0.50 | 1050 | 0 | 10 | 110 | 7.5 | 1.50 |
| Example 2 | FIG. 1 | TiN | 2100 | 0.75 | 1575 | 0 | 0 | 110 | 7.5 | 1.50 |
| Example 3 | FIG. 1 | TiN | 2100 | 1.00 | 2100 | 0 | 0 | 110 | 7.5 | 1.50 |
| Example 4 | FIG. 1 | W | 350 | 2.00 | 700 | 0 | 5 | 110 | 7.5 | 1.52 |
| Reference Example 1 | FIG. 1 | Si | 1150 | 0.4 | 460 | 0 | 70 | 75 | — | — |
| Reference Example 2 | FIG. 1 | Si | 1150 | 0.6 | 690 | 0 | 25 | 100 | — | — |
| Reference Example 3 | FIG. 1 | Si | 1150 | 0.8 | 920 | 0 | 0 | 110 | — | — |

(Evaluation Result)

As shown in Table 1, in Comparative Example 1, the forward voltage Vf and the light output power Po were lower as compared with other test samples. This is because the light transmitting insulating film and the reflective layer were not provided right under the pad portion. On the other hand, in Comparative Example 2, the light transmitting insulating film and the reflective layer were provided right under the pad portion, so that a higher power output was obtained as compared with Comparative Example 1. However, after wire bonding, some of the samples were found to have peeling at the pad portions, and all of the samples had pad portions peeling from the insulating film after the ball shear test. Moreover, the ball shear strength was low. Devices having such peeling caused after bonding are not appropriate as products, and the peeling rate after bonding is desirably 0%.

Further, in Comparative Examples 3 to 6 and Reference Example 1, in each of which the product of the Vickers hardness HV and the thickness t is 630 Hv·m or less, the pad portions have low mechanical reliability as in Comparative Example 2. In Comparative Example 3, the Pt film is made of a conductive material having a low Vickers hardness of 41 Hv, and the Pt film was plastically deformed upon wire bonding, and the stresses caused in the pad portion was not reduced. Further, a W film having a relatively high Vickers hardness was used in Comparative Example 4, whereas a TiN film having a high Vickers hardness of 2100 Hv was used in Comparative Example 5. However, both of the films had insufficient thickness, and the films were cracked; thus, the stresses caused by wire bonding were not reduced as well. As structure, and thus the stresses caused in pad portions by wire bonding were successfully reduced. Further, low resistivity $(21.7 \times 10^{-8} \; \Omega \cdot m)$ of TiN did not increase the forward voltage Vf as well. However, the forward voltage Vf was slightly increased with W. Tungsten generally having a low resistivity of $5.29 \times 10^{-8} \; \Omega \cdot m$ (R.T.) increased the forward voltage Vf, which shows that the risk for increase in the forward voltage Vf is lower when a film has high hardness and the thickness required for sufficient strength is low than when the film has low hardness and the thickness required for sufficient strength is high.

INDUSTRIAL APPLICABILITY

According to the present invention, a conductive hard film satisfying HV×t>630, where HV refers to Vickers hardness HV (Hv) and t refers to thickness (μm), is disposed between a reflective layer and a pad electrode. Thus, the above described action made it possible to suppress peeling of a pad portion during wire bonding while minimizing the blocking of light due the pad electrode.

REFERENCE SIGNS LIST

100: Semiconductor light emitting diode
101: N-type semiconductor layer (first conductivity-type semiconductor layer)
102: Light emitting layer (light emitting portion)
103: P-type semiconductor layer (second conductivity-type semiconductor layer)

104: Semiconductor layer
105: Pad electrode
106: Light transmitting insulating layer
107: Reflective layer
108: Reflective portion
109: Ohmic electrode (contact portion)
110: Conductive hard film
111: Ohmic electrode
112: Insulating film
113: Reflective layer
114: Metal bonding layer
115: Support substrate
116: Lower electrode

The invention claimed is:

1. A semiconductor light emitting diode having a semiconductor layer including a light emitting portion, and a pad electrode located on the semiconductor layer, comprising:
   between the semiconductor layer and the pad electrode,
   a reflective portion including a light transmitting insulating layer serving as a current blocking layer located on the semiconductor layer, and a reflective layer located on the light transmitting insulating layer;
   a contact portion formed from an ohmic electrode in contact with the reflective portion, located on the semiconductor layer; and
   a conductive hard film between the reflective layer and the pad electrode,
   wherein the conductive hard film has HV×t>630, where Vickers hardness is HV (Hv) and the thickness is t (μm), which the conductive hard film has a Vickers hardness HV of 1500 Hv or more, and has a thickness t of 2 μm or less.

2. The semiconductor light emitting diode according to claim 1, wherein the conductive hard film has a Vickers hardness HV higher than both of the Vickers hardnesses of the pad electrode and the reflective layer.

3. The semiconductor light emitting diode according to claim 1, wherein the conductive hard film has a thickness t of 0.3 μm or more.

4. The semiconductor light emitting diode according to claim 1, wherein the conductive hard film is made of a nitride of any one of Ti, Cr, W, and Mo.

5. The semiconductor light emitting diode according to claim 1, wherein a voltage drop during supply of a current to the conductive hard film is equal to or less than the threshold voltage of the semiconductor layer.

6. The semiconductor light emitting diode according to claim 1, wherein the conductive hard film entirely covers the reflective layer and at least a part of the ohmic electrode.

7. The semiconductor light emitting diode according to claim 1, wherein the ohmic electrode is formed to surround the reflective portion.

* * * * *